United States Patent [19]

Fujita et al.

[11] Patent Number: 4,465,727
[45] Date of Patent: Aug. 14, 1984

[54] CERAMIC WIRING BOARDS

[75] Inventors: Tsuyoshi Fujita; Noriyuki Taguchi, both of Yokohama; Gyozo Toda, Hino; Takashi Kuroki; Shoosaku Ishihara, both of Yokohama, all of Japan

[73] Assignee: Hitachi, Ltd., Tokyo, Japan

[21] Appl. No.: 374,874

[22] Filed: May 4, 1982

[30] Foreign Application Priority Data

May 9, 1981 [JP] Japan ................... 56-68889

[51] Int. Cl.$^3$ .................. H05K 3/00; H05K 1/04; B32B 3/24
[52] U.S. Cl. .................. 428/138; 428/697; 428/701; 428/702; 428/901; 29/851; 156/89; 339/17 A; 174/68.5

[58] Field of Search .................. 29/851, 849, 852; 156/89; 428/138, 901, 701, 702, 697; 427/97; 339/17 A; 174/68.5

[56] References Cited

FOREIGN PATENT DOCUMENTS 2040589 8/1980 United Kingdom .................. 29/851

Primary Examiner—Alexander Thomas
Attorney, Agent, or Firm—Antonelli, Terry & Wands

[57] ABSTRACT

A ceramic wiring board which comprises ceramic part in which through-holes are made, sintered wiring pattern part provided on the surface of said ceramic part and sintered conductor part filled in said through-holes shows much decrease in cracks at the through-hole part caused by sintering and remarkable reduction in moisture absorbency when the ceramic part comprises ceramic containing a sintering assistant and the sintered conductor part comprises a metal containing the same sintering assistant as that present in said ceramic part.

14 Claims, 1 Drawing Figure

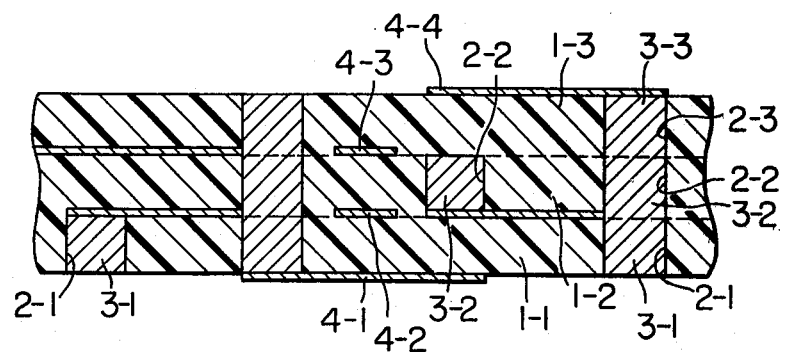

CERAMIC WIRING BOARDS

BACKGROUND OF THE INVENTION

1. Field of the Invention

This invention relates to ceramic wiring boards and more particularly to wiring boards wherein at least the conductor filled in through-hole parts of ceramic substrates is improved.

2. Brief Description of the Prior Art

Hitherto, ceramic wiring boards have been made by screen printing a wiring pattern with a conductor paste containing a metal powder selected from W powder and Mo powder as a conductive component on a ceramic green sheet mainly composed of $Al_2O_3$ and then sintering this green sheet.

Recently, with integration of wiring boards, multi-layer ceramic wiring boards have attracted a great deal of attention. Multilayer ceramic wiring boards have been made by the following steps (a)–(g). That is, (a) mixing a mixture of $Al_2O_3$ powder and a sintering assistant which is molten at 1300° C.–1500° C., e.g., powder of at least one compound selected from $SiO_2$-MgO-$Al_2O_3$ low melting compounds, kaolinite and dolomite with an organic binder, e.g., butyral, polyvinyl alcohol, etc. and an organic solvent, e.g., trichloroethylene, alcohols, etc. to obtain a slurry material, (b) casting this slurry material by doctor blade to form a ceramic green sheet of the disired thickness, (c) making through-holes (of 200 μm or more in diameter according to the present techniques) at desired positions of this green sheet by drills and the like, (d) screen printing on this green sheet a wiring pattern (of 10–20 μm in thickness according to the present techniques) with a conductor paste composed of a conductive component selected from W powder and Mo powder, an organic binder, e.g., ethylcellulose, nitrocellulose, and an organic solvent, e.g., α-terpineol, n-butyl carbitol and simultaneously filling said conductor paste in the through-holes, (e) stacking the desired number of said green sheets with the through-holes connected in registration between the sheets and pressing them at 80° C.–150° C. at which the organic binder in said green sheets is softened to make them into a laminate, (f) sintering this laminate at 1550° C.–1600° C. in a reducing atmosphere and (g) plating the conductor paths exposed on the surface with Ni or Ni-Au to make connection of components easy and simultaneously to improve corrosion resistance.

However, when multi-layer ceramic wiring boards are produced in the manner as mentioned above, the green sheet part is sintered with great contraction at temperatures from melting temperature of the sintering assistant to sintering temperature of $Al_2O_3$ and the wiring pattern part into which the sintering assistant penetrates from the surrounding green sheet part is also sintered with a great contraction like the green sheet part. On the other hand, since the sintering assistant does not penetrate into inner portion of the conductor paste part filled in the through-holes from the surrounding green sheet part, the conductor paste part is not sufficiently sintered as compared with the green sheet part and hence does not become dense and furthermore contraction of the paste part is small and hence a large strain remains in the vicinity of the through-holes after sintering, which causes cracks and warpage of the wiring board. Furthermore, when the conductor paths on the surface of multilayer ceramic wiring boards are plated, plating solution penetrates into the sintered conductor in the through-holes and this plating solution corrodes the through-holes to result in high resistance and finally disconnection. [See "Electron Components Conf. 30th ('80)" 283–285 and "Proc 23rd ECC ('73)," 204–211].

SUMMARY OF THE INVENTION

The object of this invention is to provide a ceramic wiring board which shows neither warp nor crack of ceramic substrates and furthermore which shows no corrosion of the sintered conductor in the through-holes.

The above object can be attained by using at least the sintered conductor part filled in the through-holes which comprises a metal and the same compound as the sintering assistant used in the ceramic substrate.

When at least the sintered conductor filled in the through-holes comprises said components, no strain is present in the vicinity of the through-holes and the conductor becomes dense. Thus, no warp and crack of ceramic substrates occur and no defective products are produced. Furthermore, since the sintered conductor filled in the through-holes is not corroded, disconnection of the sintered wiring conductor does not occur during use and reliability is increased.

Explanation will be made of the materials used in this invention.

The ceramic substrates comprise (a) as ceramic a metal oxide selected from $Al_2O_3$ (m.p. 2015° C.), MgO (m.p. 2800° C.), $SiO_2$ (m.p. 1273° C.), $ZrO_2$ (m.p. 2677° C.) and BeO (m.p. 2550° C.) or a compound selected from murite ($3Al_2O_3.2SiO_2$, m.p. 1830° C.), forsterite ($2MgO.SiO_2$, m.p. 1900° C.) and steatite ($MgO.SiO_2$, m.p. 1600° C.) and (b) as sintering assistant at least one compound selected from $SiO_2$-MgO-$Al_2O_3$ low melting compounds, e.g., cordierite ($2MgO.2Al_2O_3.5SiO_2$, m.p. 1500° C.), $SiO_2$-MgO-CaO low melting compounds, e.g., diopside {(Ca, Mg)O.MgO.$2SiO_2$, m.p. 1400° C.), $Al_2O_3$-$SiO_2$ minerals, e.g., kaolinite ($Al_2O_3.2SiO_2.2H_2O$, m.p. 1587° C.), MgO-CaO minerals, e.g., dolomite {(Mg, Ca)($CO_3$)$_2$, m.p. 2370° C.) and MgO-$SiO_2$ minerals, e.g., talc ($3MgO.4SiO_2.H_2O$, m.p. 1543° C.).

With reference to the mixing ratio of the compound (a) and the sintering assistant (b), a sintering acceleration effect is recognized with 99.9 wt% or less of said ceramic (a) and 0.1 wt% or more of said sintering assistant (b), but preferred mixing ratio for obtaining sufficient effect of lowering the sintering temperature is 80–95 wt% of said ceramic (a) and 20–5 wt% of said sintering assistant (b).

The conductor paste comprises (c) a metal powder selected from W powder and Mo powder, (b) a sintering assistant mentioned hereinabove with reference to the ceramic substrates, (d) an organic binder, e.g., nitrocellulose, ethylcellulose and (e) an organic solvent, e.g., α-terpineol, n-butyl carbitol acetate.

The mixing ratio of said sintering assistant (b) and said metal powders (c) is 0.5–20 wt% of the former and 99.5–80 wt% of the latter. When the amount of the sintering assistant (b) is less than 0.5 wt%, sufficient sintering effect cannot be obtained and when more than 20 wt%, conductivity is extremely damaged.

The organic binder (d) and the organic solvent (e) are organic materials necessary for obtaining a conductive paste using the sintering assistant powder (b) and the metal powder (c). Mixing ratios of the organic binder (d) and the organic solvent (e) to the total amount of the sintering assistant powder (b) and the metal powder (c) are 5–10 wt% and 60–75 wt% to 20–30 wt% of (b)+(c), respectively. Viscosity of the paste prepared at such mixing ratios is the viscosity suitable for printing, for example, $10^3$–$10^4$ poises by shear rate (1/sec).

Method of making ceramic wiring boards will be explained below.

First, 65–75 wt% of a mixed powder comprising 80–95 wt% of ceramic (a) and 20–5 wt% of sintering assistant (b) is mixed with 5–10 wt% of at least one organic binder selected from butyral resin and polyvinyl alcohol and 15–30 wt% of at least one organic solvent selected from trichloroethylene and an alcohol to obtain a slurry material. This slurry material is cast by an ordinary doctor blade and heat treated at 80°–120° C. for about 30–3 hours to obtain a sheet-like molded material called ceramic green sheet.

In thus obtained ceramic green sheet are made through-holes of 0.1 mm–0.5 mm in diameter at the desired positions by electron beam or mechanical means such as press, punch, drill, etc. In these through-holes is filled said conductive paste by screen printing process. Furthermore, the desired wiring pattern is formed by screen printing process on the surface of the green sheet having through-holes filled with the conductive paste. In this case, the conductive paste for formation of the wiring pattern may be the conductor paste mentioned hereinbefore or this conductor paste from which the sintering assistant (b) is omitted.

A plurality of these ceramic green sheets having through-holes filled with the conductor paste and printed wiring patterns are stacked with registration so as to ensure that wirings can be connected between the sheets. Then, the stacked sheets are pressed with heat under a pressure of 5 kg/cm²–40 kg/cm² at 80° C.–150° C. for 5 minutes–15 minutes to obtain an unsintered multilayer wiring board.

This unsintered multi-layer wiring board is sintered in a mixed atmosphere of $N_2$, $H_2$ and $H_2O$ at a temperature of at least the melting point of said sintering assistant (b) and less than the melting point of said ceramic (a), e.g., at 1500° C.–1600° C. when $Al_2O_3$ is used as the compound (a) and cordierite as said sintering assistant (b). Composition of the atmosphere gas is usually $N_2$: 70–80 vol%, $H_2$: 15–20 vol% and $H_2O$: 5–10 vol%. Heating rate at the sintering is usually 50°–200° C./hr and retention time at maximum temperature is usually about 0.5–2 hours.

BRIEF DESCRIPTION OF THE DRAWING

FIG. 1 is a partial cross-sectional view of the ceramic multi-layer wiring board.

DETAILED DESCRIPTION OF PREFERRED EMBODIMENTS

This invention will be explained in more detail by the following examples.

EXAMPLE 1

70 g of a mixture of 90 wt% of $Al_2O_3$ powder having a mean particle diameter of 4 μm, 6 wt% of talc powder having a mean particle diameter of 5 μm and 4 wt% of kaolinite powder having a mean particle diameter of 3 μm was mixed with 8 g of butyral resin and 22 g of trichloroethylene to obtain a slurry material. This was cast by a doctor blade to obtain green sheets 1-1, 1-2 and 1-3 of 0.3 mm thick. Through-holes 2-1, 2-2 and 2-3 of 0.25 mm in diameter were made at an interval of 0.5 mm in said green sheets by a punch. By subjecting these ceramic green sheets 1-1, 1-2 and 1-3 to screen-printing with a conductor paste prepared by homogeneously mixing 25 g of a mixed powder comprising 90 wt% of W powder having a mean particle diameter of 2 μm, 6 wt% of talc powder having a mean particle diameter of 5 μm and 4 wt% of kaolinite powder having a mean particle diameter of 3 μm, 8 g of ethylcellulose and 67 g of α-terpineol, through-holes 2-1, 2-2 and 2-3 were filled with this conductor paste, namely, 3-1, 3-2 and 3-3 and simultaneously the desired wiring patterns 4-1, 4-2, 4-3 and 4-4 were formed.

These green sheets having the through-holes filled with the conductor paste and the wiring patterns printed thereon were stacked with the wirings connected in register between the sheets and pressed with heat under 20 kg/cm² at 120° C. for 10 minutes to obtain an unsintered multi-layer wiring board.

This unsintered multi-layer wiring board was sintered in an atmosphere of $N_2$: 75 vol%, $H_2$: 17 vol% and $H_2O$: 8 vol% by heating it at a temperature of 1600° C. at a heating rate of 130° C./hr and retaining it at the sintering temperature for 1.5 hour to obtain a multi-layer ceramic wiring board.

This multi-layer ceramic wiring board was subjected to a thermal shock test 50 times, which comprised leaving it to stand at 0° C. for 1 hour and then at 100° C. for 1 hour to find that 0.01% of cracks occurred at the through-hole part. On the other hand, when the conventional multilayer ceramic wiring board was subjected to the same thermal shock test, 10–15% of cracks occurred at the through-hole part.

Furthermore, water absorption of said multi-layer ceramic wiring board of this invention was 0.001% while that of the conventional multi-layer ceramic wiring board was about 0.2%.

EXAMPLE 2

Example 1 was repeated except that a conductor paste obtained by homogeneously mixing 20 g of a mixed powder comprising 99.5 wt% of W powder having a mean particle diameter of 2 μm, 0.3 wt% of talc powder having a mean particle diameter of 5 μm and 0.2 wt% of kaolinite powder having a mean particle diameter of 3 μm, 5 g of nitrocellulose and 75 g of n-butyl carbitole acetate was used for formation of wiring patterns and filling of the through-holes. Thus obtained multi-layer ceramic wiring board had good characteristics like that of Example 1.

EXAMPLE 3

A multi-layer ceramic wiring board was made in the same manner as in Example 1 except that a conductor paste obtained by homogeneously mixing 30 g of a mixed powder which comprised 80 wt% of Mo powder having a mean particle diameter of 2 μm, 10 wt% of talc powder having a mean particle diameter of 5 μm and 10 wt% of kaolinite powder having a mean particle diameter of 3 μm, 10 g of ethylcellulose and 60 g of α-terpineol was used for formation of the wiring patterns and filling of the through-holes. This multi-layer ceramic wiring board had good characteristics like that of Example 1.

EXAMPLE 4

A multi-layer ceramic wiring board was made in the same manner as in Example 1 except that a slurry material comprising 65 wt% of a mixture of 80 wt% of $Al_2O_3$ powder having a mean particle diameter of 4 μm, 10 wt% of talc powder having a mean particle diameter of 5 μm and 10 wt% of kaolinite powder having a mean particle diameter of 3 μm, 5 wt% of polyvinyl alcohol and 30 wt% of ethyl alcohol was used for producing the green sheets; pressure, heating temperature and heating time at production of the unsintered mult-layer ceramic wiring board were 5 kg/cm², 150° C. and 15 minutes, respectively; sintering atmosphere comprised $N_2$: 70 vol%, $H_2$: 20 vol% and $H_2O$: 10 vol%; heating rate was 50° C./hr, sintered temperature was 1510° C.; and retention time at the sintering temperature was 0.5 hr. Thus obtained multi-layer ceramic wiring board had good characteristics like that of Example 1.

EXAMPLE 5

A multi-layer ceramic wiring board was produced in the same manner as in Example 1 except that a slurry material comprising 75 wt% of a mixture of 95 wt% of $Al_2O_3$ powder having a particle diameter of 4 μm and 5 wt% of talc powder having a mean particle diameter or 5 μm, 10 wt% of polyvinyl alcohol and 15 wt% of ethyl alcohol was used for production of the green sheets; pressure, heating temperature and heating time at production of unsintered multi-layer ceramic wiring board were 40 kg/cm², 80° C. and 5 minute, respectively; sintering atmosphere comprised $N_2$: 80 vol%, $H_2$: 45 vol% and $H_2O$: 5 vol%; heating rate was 200° C./hr, sintering temperature was 1650° C.; and retention time at the sintering temperature was 2 hours. Thus obtained multi-layer ceramic wiring board had good characteristics like that of Example 1.

EXAMPLE 6

A multi-layer ceramic wiring board was produced in the same manner as in Example 1 except that a homogeneous mixture of 25 g of W powder having a mean particle diameter of 2 μm, 8 g of ethylcellulose and 67 g of α-terpineol was used as the conductor paste for formation of wiring patterns. This wiring board had good characteristics like that of Example 1.

EXAMPLE 7

In the same manner as in Example 1, a ceramic green sheet having through-holes filled with the conductor paste and wiring patterns printed thereon was produced. This ceramic green sheet was sintered in the same manner as in Example 1 except that it was not pressed, to obtain a ceramic wiring board. This ceramic wire board had good characteristics like that of Example 1.

What is claimed is:

1. A ceramic wiring board which comprises ceramic part in which through-holes are made, sintered wiring pattern part provided on the surface of said ceramic part and sintered conductor part filled in said through-holes wherein said ceramic part comprises 80–99.9 wt% of ceramic and 0.1 wt% or more of a sintering assistant and at least said sintered conductor part filled in said through-holes is a conductor which comprises 80–99.5 wt% of a metal and 20–0.5% of the same sintering assistant as used in the ceramic part.

2. A ceramic wiring board according to claim 1 wherein said sintering assistant is at least one compound selected from the group consisting of $SiO_2$-$MgO$-$Al_2O_3$ low melting compounds, $SiO_2$-$MgO$-$CaO$ low melting compounds, $Al_2O_3$-$SiO_2$ minerals, $MgO$-$CaO$ minerals, and $MgO$-$SiO_2$ minerals.

3. A ceramic wiring board according to claim 1 wherein said sintering assistant is at least one compound selected from the group consisting of $SiO_2$-$MgO$-$Al_2O_3$ low melting compounds, $SiO_2$-$MgO$-$CaO$ low melting compounds, $MgO$-$CaO$ minerals, $Al_2O_3$-$SiO_2$ minerals, and $MgO$-$SiO_2$ minerals and said metal is at least one metal selected from the group consisting of W and Mo.

4. A ceramic wiring board according to claim 2 or 3 wherein said $SiO_2$-$MgO$-$Al_2O_3$ low melting compound is cordierite, said $SiO_2$-$MgO$-$CaO$ low melting compound is diopside, said $Al_2O_3$-$SiO_2$ mineral is kaolinite, said $MgO$-$CaO$ mineral is dolomite and said $MgO$-$SiO_2$ mineral is talc.

5. A ceramic wiring board according to claim 1 wherein said ceramic is a metal oxide selected from the group consisting of $Al_2O_3$, $MgO$, $SiO_2$, $ZrO$ and $BeO$ or a metal oxide selected from the group consisting of murite, forsterite and steatite.

6. A ceramic wiring board according to claim 1 wherein said ceramic is a metal oxide selected from the group consisting of $Al_2O_3$, $MgO$, $SiO_2$, $ZrO$ and $BeO$ or a metal oxide selected from the group consisting of murite, forsterite and steatite, said sintering assistant is at least one compound selected from the group consisting of $SiO_2$-$MgO$-$Al_2O_3$ low melting compounds, $SiO_2$-$MgO$-$CaO$ low melting compounds, $Al_2O_3$-$SiO_2$ minerals, $MgO$-$CaO$ minerals and $MgO$-$SiO_2$ minerals and said metal is at least one metal selected from the group consisting of W and Mo.

7. A ceramic wiring board according to claim 1 wherein said ceramic is a metal oxide selected from the group consisting of $Al_2O_3$, $MgO$, $SiO_2$, $ZrO$ and $BeO$ or a metal oxide selected from the group consisting of murite, forsterite and steatite, said sintering assistant is at least one compound selected from the group consisting of cordierite, diopside, kaolinite, dolomite and talc and said metal is at least one metal selected from the group consisting of W and Mo.

8. A ceramic wiring board according to claim 1 wherein said ceramic part comprises 80–95 wt% of ceramic and 20–5 wt% of a sintering assistant and said sintered conductor part is a conductor comprising 80–99.5 wt% of metal and 20–0.5 wt% of sintering assistant.

9. A ceramic wiring board according to claim 8 wherein said sintering assistant is at least one compound selected from the group consisting of $SiO_2$-$MgO$-$Al_2O_3$ low melting compounds, $SiO_2$-$MgO$-$CaO$ low melting compounds, $Al_2O_3$-$SiO_2$ minerals, $MgO$-$CaO$ minerals and $MgO$-$SiO_2$ minerals.

10. A ceramic wiring board according to claim 8 wherein said sintering assistant is at least one compound selected from the group consisting of $SiO_2$-$MgO$-$Al_2O_3$ low melting compounds, $SiO_2$-$MgO$-$CaO$ low melting compounds, $Al_2O_3$-$SiO_2$ minerals, $MgO$-$CaO$ minerals and $MgO$-$SiO_2$ minerals and said metal is at least one metal selected from the group consisting of W and Mo.

11. A ceramic wiring board according to claim 9 or 10 wherein said $SiO_2$-$MgO$-$Al_2O_3$ low melting compound is cordierite, said $SiO_2$-$MgO$-$CaO$ low melting compound is diopside, said $Al_2O_3$-$SiO_2$ mineral is kaolinite, said $MgO$-$CaO$ mineral is dolomite, and said $MgO$-$SiO_2$ mineral is talc.

12. A ceramic wiring board according to claim 8 wherein said ceramic is a metal oxide selected from the group consisting of $Al_2O_3$, $MgO$, $SiO_2$, $ZrO$ and $BeO$ or a metal oxide selected from the group consisting of murite, forsterite and steatite.

13. A ceramic wiring board according to claim 8 wherein said ceramic is a metal oxide selected from the group consisting of Al$_2$O$_3$, MgO, SiO$_2$, ZrO and BeO or a metal oxide selected from the group consisting of murite, forsterite and steatite, said sintering assistant is at least one compound selected from the group consisting of SiO$_2$-MgO-Al$_2$O$_3$ low melting compounds, SiO$_2$-MgO-CaO low melting compounds, Al$_2$O$_3$-SiO$_2$ minerals, MgO-CaO minerals, and MgO-SiO$_2$ minerals and said metal is at least one metal selected from the group consisting of W and Mo.

14. A ceramic wiring board according to claim 8 wherein said ceramic is a metal oxide selected from the group consisting of Al$_2$O$_3$, MgO, SiO$_2$, ZrO and BeO or a metal oxide selected from the group consisting of murite, forsterite and steatite, said sintering assistant is at least one compound selected from the group consisting of cordierite, diopside, kaolinite, dolomite and talc and said metal is at least one metal selected from the group consisting of W and Mo.

* * * * *